United States Patent
Heo et al.

(10) Patent No.: US 9,281,404 B2
(45) Date of Patent: Mar. 8, 2016

(54) THREE-DIMENSIONAL GRAPHENE SWITCHING DEVICE

(71) Applicant: Samsung Electronics Co., Ltd., Suwon-Si, Gyeonggi-Do (KR)

(72) Inventors: Jin-seong Heo, Seoul (KR); Seong-jun Park, Seoul (KR); Kyung-eun Byun, Uijeongbu-si (KR); David Seo, Yongin-si (KR); Hyun-jae Song, Hwaseong-si (KR); Hee-jun Yang, Seoul (KR); Hyun-jong Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/733,304

(22) Filed: Jan. 3, 2013

(65) Prior Publication Data

US 2013/0175506 A1 Jul. 11, 2013

(30) Foreign Application Priority Data

Jan. 10, 2012 (KR) ...................... 10-2012-00030709

(51) Int. Cl.
*H01L 29/06* (2006.01)
*H01L 29/08* (2006.01)
*H01L 29/786* (2006.01)
*H01L 29/423* (2006.01)

(52) U.S. Cl.
CPC ...... *H01L 29/78684* (2013.01); *H01L 29/0673* (2013.01); *H01L 29/42392* (2013.01); *H01L 29/78696* (2013.01)

(58) Field of Classification Search
CPC .................................................. H01L 29/78684
USPC ............................................................ 257/29
See application file for complete search history.

(56) References Cited

U.S. PATENT DOCUMENTS

| 9,159,805 | B2 * | 10/2015 | Dai .................... H01L 29/66742 |
| 2009/0020764 | A1 * | 1/2009 | Anderson et al. ................ 257/77 |
| 2009/0181502 | A1 * | 7/2009 | Parikh et al. .................... 438/164 |
| 2010/0214012 | A1 | 8/2010 | Raza |
| 2010/0258787 | A1 * | 10/2010 | Chae et al. ....................... 257/39 |
| 2011/0059599 | A1 * | 3/2011 | Ward et al. ...................... 438/507 |
| 2011/0101309 | A1 | 5/2011 | Lin et al. |
| 2011/0108802 | A1 | 5/2011 | Lin et al. |
| 2011/0108806 | A1 | 5/2011 | Davidovic et al. |
| 2011/0227044 | A1 * | 9/2011 | Kawanaka et al. .............. 257/29 |
| 2012/0258587 | A1 * | 10/2012 | Kub et al. ........................ 438/610 |
| 2012/0326128 | A1 * | 12/2012 | Shin et al. ......................... 257/29 |
| 2013/0001573 | A1 * | 1/2013 | Lee et al. .......................... 257/60 |
| 2013/0048948 | A1 * | 2/2013 | Heo et al. ......................... 257/27 |
| 2013/0048951 | A1 * | 2/2013 | Heo ......................... B82Y 10/00 257/29 |
| 2013/0075700 | A1 | 3/2013 | Yang et al. |
| 2013/0082241 | A1 * | 4/2013 | Kub et al. ........................ 257/21 |
| 2013/0189444 | A1 * | 7/2013 | Kub et al. ....................... 427/523 |
| 2013/0207080 | A1 * | 8/2013 | Dimitrakopoulos H01L 29/4908 257/24 |

* cited by examiner

*Primary Examiner* — Matthew Landau
*Assistant Examiner* — Igwe U Anya
(74) *Attorney, Agent, or Firm* — Harness, Dickey & Pierce, P.L.C.

(57) ABSTRACT

A switching device includes a semiconductor layer, a graphene layer, a gate insulation layer, and a gate formed in a three-dimensional stacking structure between a first electrode and a second electrode formed on a substrate.

15 Claims, 3 Drawing Sheets

THREE-DIMENSIONAL GRAPHENE SWITCHING DEVICE

CROSS-REFERENCE TO RELATED APPLICATIONS

This application claims the benefit of priority under 35 U.S.C. §119 to Korean Patent Application No. 10-2012-0003079, filed on Jan. 10, 2012, in the Korean Intellectual Property Office, the disclosure of which is incorporated herein by reference in its entirety.

BACKGROUND

1. Field

Some example embodiments relate to graphene switching devices having a three-dimensional structure.

2. Description of the Related Art

Graphene has a 2-dimensional hexagonal carbon structure and has become generally known as a new material capable of replacing semiconductors. Thus, much research is being actively performed worldwide on graphene applications.

In particular, graphene is a zero gap semiconductor. When a graphene nano-ribbon (GNR) is formed by limiting a channel width thereof below 10 nm, a bandgap is formed due to a size effect. Thus, a field effect transistor that is drivable at room temperature may be manufactured using the GNR.

However, although an on/off ratio of graphene is improved when manufacturing the GNR, mobility decreases due to a disordered edge, and thus, an on current is relatively small.

Recently, a method of forming a bandgap by applying an electric field to bilayered graphene has been used as an alternative to forming GNR as described above. However, in this case, it is difficult to form graphene having a uniform bilayer structure by using a large-scaled chemical vapor deposition (CVD) method, and also practical use of this method is difficult due to formation of a random domain.

SUMMARY

Some example embodiments provide three-dimensional graphene switching devices wherein contact areas between graphene and other layers (an insulation layer, a semiconductor layer or a gate) are maximized or increased.

According to an example embodiment, a three-dimensional graphene switching device includes first and second electrodes spaced apart from each other on a substrate, a semiconductor layer and a graphene layer between the first electrode and the second electrode, the graphene layer surrounding an end portion of the semiconductor layer, a gate insulation layer surrounding the graphene layer, and a gate surrounding the gate insulation layer.

A first end portion of the semiconductor layer may contact a portion of the first electrode, a second end portion of the semiconductor layer may be connected to a first end portion of the graphene layer, and a second end portion of the graphene layer may contact a portion of the second electrode.

The first end portion of the graphene layer may be on an upper side and on lateral sides of the semiconductor layer. The gate insulation layer may be on an upper side and on lateral sides of the graphene layer. The gate may surround an upper side and lateral sides of the gate insulation layer on the second end portion of the semiconductor layer and the first end portion of the graphene layer.

The first electrode and the second electrode may include one of metal, conductive metal oxide, conductive metal nitride, and polysilicon. The semiconductor layer may include one of silicon, germanium, silicon-germanium, Group III-V semiconductor material, Group II-VI semiconductor material and an oxide semiconductor.

An energy bandgap of the semiconductor layer may change with a voltage applied to the gate. The graphene layer may include up to four layers of graphene.

According to another example embodiment, a three-dimensional graphene switching device array includes the above three-dimensional graphene switching device.

According to yet another example embodiment, there is provided a switching device including a semiconductor layer on a substrate, a graphene layer on the substrate, a portion of the graphene layer covering a portion of the semiconductor layer, a gate insulating layer over at least the portion of the graphene layer, and a gate over a portion of the gate insulating layer and the portion of the graphene layer.

The gate insulating layer may cover the graphene layer.

The switching device may further include a first electrode contacting the semiconductor layer, and a second electrode contacting the graphene layer.

BRIEF DESCRIPTION OF THE DRAWINGS

Example embodiments will be more clearly understood from the following detailed description taken in conjunction with the accompanying drawings. FIGS. 1-5B represent non-limiting, example embodiments as described herein.

FIG. 1 is a perspective view of a three-dimensional graphene switching device 100 according to an example embodiment;

FIG. 3 is a plan view illustrating an array structure of a three-dimensional graphene switching device, according to an example embodiment;

FIGS. 5A and 5B are diagrams illustrating a second modification example of the three-dimensional graphene switching device, according to an example embodiment.

DETAILED DESCRIPTION

Figure 1:
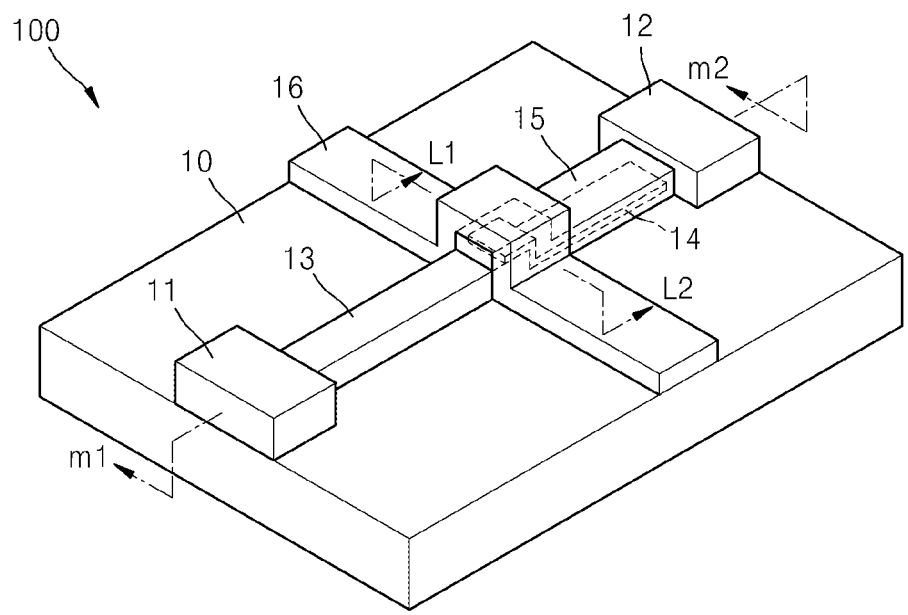

Example embodiments will now be described more fully with reference to the accompanying drawings, in which example embodiments are shown. In the drawings, thicknesses of layers or areas are exaggerated for clarity. Like reference numerals in the drawings denote like elements.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a three-dimensional graphene switching device according to an example embodiment.

Referring to FIG. 1, a three-dimensional graphene switching device 100 includes a substrate 10 and first and second electrodes 11 and 12 that are formed spaced apart from each other on the substrate 10. A semiconductor layer 13 and a graphene layer 14 are formed between the first electrode 11 and the second electrode 12 on the substrate 10. A first end portion of the semiconductor layer 13 may be formed to contact a lateral portion of the first electrode 11, and a second end portion of the semiconductor layer 13 may be formed to be connected to a first end portion of the graphene layer 14. A second end portion of the graphene layer 14 may be formed to contact a lateral portion of the second electrode 12.

As stated above, the first end portion of the graphene layer 14 may be connected to the second end portion of the semiconductor layer 13, and may be formed to surround an upper side and lateral sides of the second end portion of the semiconductor layer 13. A gate insulation layer 15 may be formed on the graphene layer 14 to surround an upper side and lateral sides of the first end portion of the graphene layer 14 formed to surround the second end portion of the semiconductor layer 13. A gate 16 may be formed on the gate insulation layer 15, and in particular, may be formed to surround an upper side and lateral sides of an area of the gate insulation layer 15 on the second end portion of the semiconductor layer 13 and the first end portion of the graphene layer 14.

Figure 2A:
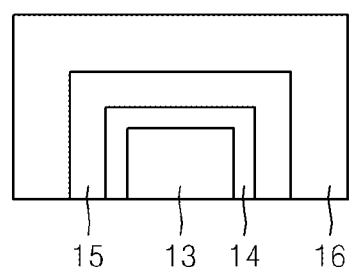
FIG. 2A is a cross-sectional view taken along line L1-L2 of FIG. 1.

FIG. 2A is a cross-sectional view taken along line L1-L2 of FIG. 1.

Referring to FIG. 2A, the graphene layer 14 is formed on the upper side and on the lateral sides of the semiconductor layer 13, the gate insulation layer 15 is formed on the upper side and on the lateral sides of the graphene layer 14, and the gate 16 is formed on the upper side and on the lateral sides of the gate insulation layer 15. In this manner, since the three-dimensional graphene switching device 100 includes a three-dimensional stacking structure maximizing or increasing a contact area between layers, an on-current of the three-dimensional graphene switching device 100 may increase due to an increase of the contact area between layers. Also, device density of the three-dimensional graphene switching device 100 may be increased in a limited area.

Figure 2B:
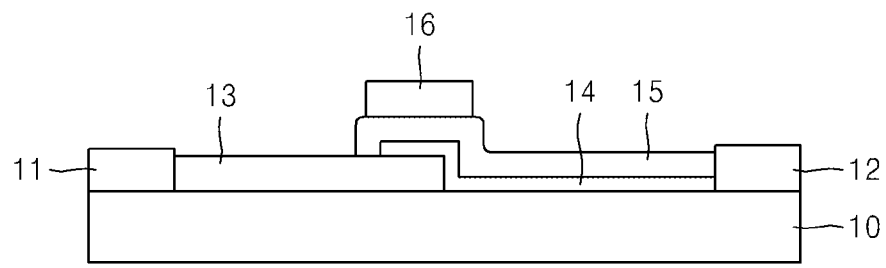
FIG. 2B is a cross-sectional view taken along line m1-m2 of FIG. 1.

FIG. 2B is a cross-sectional view taken along a line m1-m2 of FIG. 1. Referring to FIG. 2B, the first electrode 11 and the second electrode 12 are formed on both sides of the substrate 10, and the semiconductor layer 13 and the graphene layer 14 are formed between the first electrode 11 and the second electrode 12 on the substrate 10. The first end portion of the semiconductor layer 13 is formed to contact the lateral portion of the first electrode 11, and the second end portion of the semiconductor layer 13 is connected to the first end portion of the graphene layer 14. The second end portion of the graphene layer 14 is formed to contact the lateral portion of the second electrode 12. The first end portion of the graphene layer 14 is formed on the upper side and on the lateral sides of the second end portion of the semiconductor layer 13, the gate insulation layer 15 is formed on the graphene layer 14, and the gate 16 is formed on a portion of the gate insulation layer 15, which corresponds to the second end portion of the semiconductor layer 13. Although FIGS. 1 and 2B illustrate a structure in which the gate insulation layer 15 covers the whole area of the graphene layer 14, the inventive concepts are not limited thereto. That is, the gate insulation layer 15 may be formed only under the gate 16. A space between the first electrode 11 and the gate 16 and a space between the gate 16 and the second electrode 12 may be selectively adjusted by controlling the length of the semiconductor layer 13 and the length of the graphene layer 14. The length of the semiconductor layer 13 and the length of the graphene layer 14 may be several nanometers or more.

The materials for forming the layers of the three-dimensional graphene switching device 100 are described as follows.

All materials that may be used in general semiconductor devices may be unrestrictedly used as the material for forming the substrate 10. For example, a silicon substrate, a glass substrate, a GaAs substrate, and/or a sapphire substrate may be used as the substrate 10.

The first electrode 11 may be a source electrode and the second electrode 12 may be a drain electrode, or vice versa. The first electrode 11 and the second electrode 12 may be formed of a conductive material. For example, the first electrode 11 and the second electrode 12 may be formed of metal, conductive metal oxide, conductive metal nitride, or polysilicon.

The semiconductor layer 13 may be formed of various semiconductor materials. For example, the semiconductor layer 13 may be formed of silicon, germanium, silicon-germanium, III-V group semiconductor material, II-VI group semiconductor material, or an oxide semiconductor and may be doped with N-type or P-type impurities. The semiconductor layer 13 forms a barrier together with the graphene layer 14. A gate voltage, that is, a voltage applied to the gate 16, changes a doping state of the graphene layer 14, and thus, adjusts the barrier between the semiconductor layer 13 and the graphene layer 14. An energy barrier may be adjusted via the gate voltage, and thus, a junction between the semiconductor layer 13 and the graphene layer 14 becomes a tunable barrier.

The graphene switching device 100 including the tunable barrier may be a unipolar switching device, that is, an N-type switching device or a P-type switching device according to a polarity of the semiconductor layer 13. When the semiconductor layer 13 is doped with N-type impurities, the graphene switching device 100 including the tunable barrier may become the N-type switching device. When the semiconductor layer 13 is doped with P-type impurities, the graphene switching device 100 including the tunable barrier may become the P-type switching device.

The graphene layer 14 functions as a reservoir of carriers, and may form the tunable barrier together with the semiconductor layer 13. The bandgap of the graphene layer 14 may be zero. The graphene layer 14 may be formed by transferring graphene manufactured by using chemical vapor deposition (CVD) onto the substrate 10 and the semiconductor layer 13 and then patterning the graphene. The graphene layer 14 may be formed of graphene of one layer through four layers.

The gate insulation layer 15 may be formed of silicon oxide or silicon nitride. The gate 16 may be formed of an electrode material of general semiconductor devices. For example, the gate 16 may be formed of metal, conductive metal oxide, and/or conductive metal nitride. The three-dimensional graphene switching device 100 described above may be easily formed to have an array structure by arranging the first electrode 11, the second electrode 12, and the gate 16 in a line.

Figure 3:
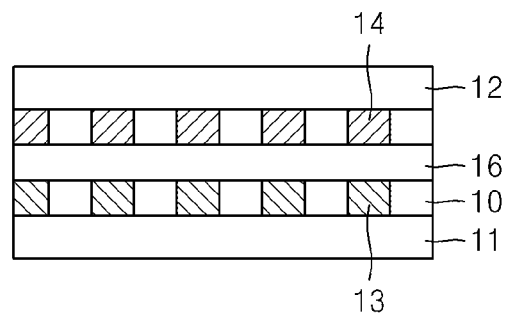

FIG. 3 is a plan view illustrating an array structure of a three-dimensional graphene switching device, according to an example embodiment.

Referring to FIG. 3, a first electrode 11 and a second electrode 12 are formed in a line in a first direction on a substrate 10, and a gate 16 is formed in the form of a line between the first electrode 11 and the second electrode 12. A semiconductor layer 13 and a graphene layer 14 may be formed between the first electrode 11 and the second electrode 12. The semiconductor layer 13 and the graphene layer 14 may be formed in a second direction crossing the first direction. The gate 16, which is formed on the semiconductor layer 13 and the graphene layer 14, may be formed in the first direction.

In the three-dimensional graphene switching device according to an example embodiment, the semiconductor layer 13 and the graphene layer 14 may be formed in various directions according to locations of the first electrode 11 and second electrode 12. For example, FIG. 1 illustrates a structure in which the semiconductor layer 13 and the graphene layer 14 are formed in the same direction on the same line.

Figure 4A:
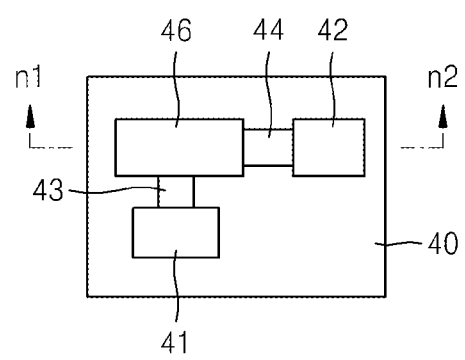
FIGS. 4A and 4B are diagrams illustrating a first modification example of the three-dimensional graphene switching device, according to an example embodiment.
Figure 4B:
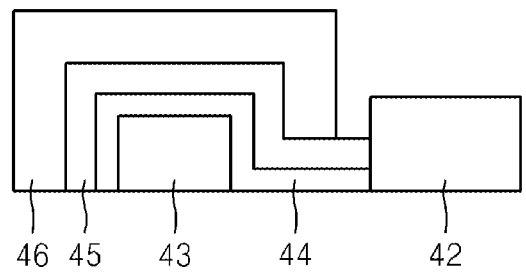

FIGS. 4A and 4B are diagrams illustrating a first modification example of the three-dimensional graphene switching device, according to an example embodiment. FIG. 4A illustrates a plan view of the first modification example, and FIG. 4B illustrates a cross-sectional view taken along a line n1-n2 of FIG. 4A.

In the first modification example illustrated in FIGS. 4A and 4B, a semiconductor layer 43 and a graphene layer 44 are formed in directions crossing each other at a right angle.

Referring to FIG. 4A, the first modification example of the three-dimensional graphene switching device includes a substrate 40 and first and second electrodes 41 and 42 that are formed spaced apart from each other on the substrate 40. The first electrode 41 may be formed to contact a first end portion of a semiconductor layer 43, and a second end portion of the semiconductor layer 43 may be formed to be connected to a first end portion of the graphene layer 44. A second end portion of the graphene layer 44 may be formed to contact a lateral side of the second electrode 42. The semiconductor layer 43 and the graphene layer 44 may be formed in directions crossing at right angles each other. The first end portion of the graphene layer 44 may be formed such that the first end portion surrounds an upper side and lateral sides of the second end portion of the semiconductor layer 43. A gate insulation layer 45 (see FIG. 4B) may be formed on the second end portion of the semiconductor layer 43 and the first end portion of the graphene layer 44, and may be formed to surround an upper side and lateral sides of the graphene layer 44. A gate 46 may be formed on the gate insulation layer 45.

Referring to FIG. 4B, the graphene layer 44 may be formed to surround the semiconductor layer 43 on the upper side and on the lateral sides of the semiconductor layer 43, the gate insulation layer 45 may be formed on the upper side and on the lateral sides of the graphene layer 44, and the gate 46 may be formed on the upper side and on the lateral sides of the gate insulation layer 45. The graphene layer 44 may be formed to contact the second electrode 42.

Figure 5A:
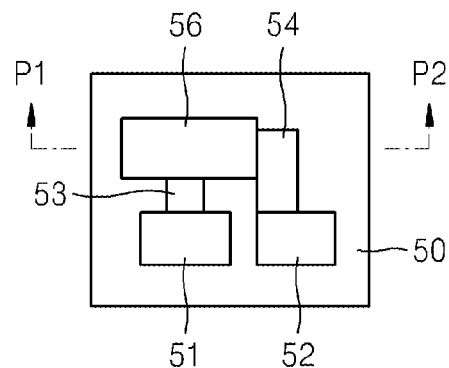
Figure 5B:
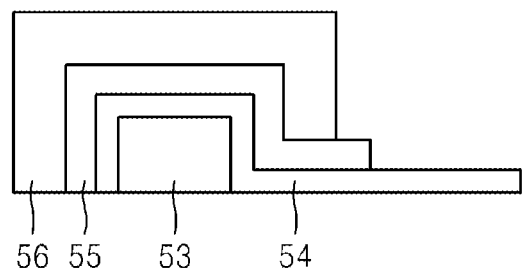

FIGS. 5A and 5B are diagrams illustrating a second modification example of the three-dimensional graphene switching device, according to an example embodiment. FIG. 5A illustrates a plan view of the second modification example, and FIG. 5B illustrates a cross-sectional view taken along a line P1-P2 of FIG. 5A.

Referring to FIG. 5A, the second modification example of the three-dimensional graphene switching device includes a substrate 50 and first and second electrodes 51 and 52 that are formed spaced apart from each other on the substrate 50. The first electrode 51 may be formed to contact a first end portion of a semiconductor layer 53 formed on the substrate 50, and a second end portion of the semiconductor layer 53 may be formed to be connected to a first end portion of the graphene layer 54. A second end portion of the graphene layer 54 may be formed to be connected to a lateral side of the second electrode 52.

The graphene layer 54 may be formed parallel with the semiconductor layer 53, and a portion of the graphene layer 54 may be formed to be bent and contact the semiconductor layer 53. A gate insulation layer 55 (see FIG. 5B) may be formed on the second end portion of the semiconductor layer 53 and the first end portion of the graphene layer 54, and may be formed such that the first portion surrounds an upper side and lateral sides of the graphene layer 54. A gate 56 may be formed on the gate insulation layer 55.

Referring to FIG. 5B, the graphene layer 54 may be formed to surround the semiconductor layer 53 on the upper side and on the lateral sides of the semiconductor layer 53, the gate insulation layer 55 may be formed on the upper side and on the lateral sides of the graphene layer 54, and the gate 56 may be formed on the upper side and on the lateral sides of the gate insulation layer 55.

As stated above, a three-dimensional graphene switching device according to an example embodiment may be formed in various forms according to locations of electrodes and a gate.

In the three-dimensional graphene switching device according to an example embodiment, a semiconductor layer, a graphene layer, a gate insulation layer, and a gate are formed in a three-dimensional stacking structure, and thus, an on-current of the three-dimensional graphene switching device may be increased due to an increase of a contact area, and device density may be increased in a limited area.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A three-dimensional graphene switching device, comprising:
    first and second electrodes spaced apart from each other on a substrate;
    a semiconductor layer and a graphene layer between the first electrode and the second electrode, the graphene layer surrounding an end portion of the semiconductor layer;
    a gate insulation layer surrounding the graphene layer; and
    a gate surrounding the gate insulation layer,
    wherein a first end portion of the semiconductor layer contacts a portion of the first electrode, a second end portion of the semiconductor layer is connected to a first end portion of the graphene layer, and a second end portion of the graphene layer contacts a portion of the second electrode.

2. The three-dimensional graphene switching device of claim 1, wherein the first end portion of the graphene layer is on an upper side and on lateral sides of the semiconductor layer.

3. The three-dimensional graphene switching device of claim 1, wherein the gate insulation layer is on an upper side and on lateral sides of the graphene layer.

4. The three-dimensional graphene switching device of claim 3, wherein the gate surrounds an upper side and lateral sides of the gate insulation layer on the second end portion of the semiconductor layer and the first end portion of the graphene layer.

5. The three-dimensional graphene switching device of claim 1, wherein the first electrode and the second electrode include one of metal, conductive metal oxide, conductive metal nitride, and polysilicon.

6. The three-dimensional graphene switching device of claim 1, wherein the semiconductor layer includes one of silicon, germanium, silicon-germanium, Group III-V semiconductor material, Group II-VI semiconductor material and an oxide semiconductor.

7. The three-dimensional graphene switching device of claim 1, wherein an energy bandgap of the semiconductor layer changes with a voltage applied to the gate.

8. The three-dimensional graphene switching device of claim 1, wherein the graphene layer includes up to four layers of graphene.

9. A three-dimensional graphene switching device array, comprising:
    the three-dimensional graphene switching device of claim 1.

10. A switching device, comprising:
    a semiconductor layer on a first region of a substrate;
    a graphene layer on a second region of the substrate different from the first region, an end portion of the graphene layer covering an end portion of the semiconductor layer on the first region of the substrate;
    a gate insulating layer over at least the end portion of the graphene layer; and
    a gate over a portion of the gate insulating layer and the end portion of the graphene layer,
    wherein the end portion of the graphene layer is on an upper side and on a lateral side of the end portion of the semiconductor layer.

11. The switching device of claim 10, wherein the gate insulating layer covers the graphene layer.

12. The switching device of claim 10, further comprising:
    a first electrode contacting the semiconductor layer; and
    a second electrode contacting the graphene layer.

13. The switching device of claim 12, wherein the first electrode contacts only the semiconductor layer, and the second electrode contacts only the graphene layer.

14. The switching device of claim 10, wherein the gate insulation layer is on an upper side and on lateral sides of the graphene layer.

15. The switching device of claim 14, wherein the gate surrounds an upper side and lateral sides of the gate insulation layer on the end portion of the semiconductor layer and the end portion of the graphene layer.

* * * * *